(12) United States Patent
Mullendore et al.

(10) Patent No.: US 8,898,548 B1
(45) Date of Patent: Nov. 25, 2014

(54) METHODS, DATA STORAGE DEVICES AND SYSTEMS HAVING VARIABLE SIZE ECC PAGE SIZE

(75) Inventors: Rodney N. Mullendore, San Jose, CA (US); Radoslav Danilak, Cupertino, CA (US); Justin Jones, Redwood City, CA (US); Andrew J. Tomlin, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 166 days.

(21) Appl. No.: 13/594,696

(22) Filed: Aug. 24, 2012

(51) Int. Cl.
*H03M 13/00* (2006.01)

(52) U.S. Cl.
USPC ........... 714/774; 714/766; 714/751; 714/752; 714/763; 714/769; 714/773; 365/185.09; 365/185.33

(58) Field of Classification Search
None
See application file for complete search history.

(56) References Cited

U.S. PATENT DOCUMENTS

| | | | |
|---|---|---|---|
| 7,363,421 B2 | 4/2008 | Di Sena et al. | |
| 7,412,585 B2 | 8/2008 | Uemura | |
| 7,441,067 B2 | 10/2008 | Gorobets et al. | |
| 7,509,471 B2 | 3/2009 | Gorobets | |
| 7,610,438 B2 | 10/2009 | Lee et al. | |
| 7,739,576 B2 * | 6/2010 | Radke | 714/758 |
| 7,810,017 B2 * | 10/2010 | Radke | 714/769 |
| 8,095,851 B2 | 1/2012 | Diggs et al. | |
| 8,307,149 B2 * | 11/2012 | Honda et al. | 711/103 |
| 8,407,449 B1 | 3/2013 | Colon et al. | |
| 8,489,854 B1 | 7/2013 | Colon et al. | |
| 2004/0088474 A1 | 5/2004 | Lin | |
| 2004/0109376 A1 | 6/2004 | Lin | |
| 2005/0172065 A1 * | 8/2005 | Keays | 711/103 |
| 2006/0155917 A1 | 7/2006 | Di Sena et al. | |
| 2007/0016721 A1 | 1/2007 | Gay | |
| 2007/0094445 A1 | 4/2007 | Trika et al. | |
| 2007/0204128 A1 | 8/2007 | Lee et al. | |
| 2007/0300037 A1 | 12/2007 | Rogers et al. | |
| 2008/0104308 A1 | 5/2008 | Mo et al. | |
| 2008/0256287 A1 | 10/2008 | Lee et al. | |
| 2008/0282024 A1 | 11/2008 | Biswas et al. | |
| 2009/0019218 A1 | 1/2009 | Sinclair et al. | |
| 2009/0049229 A1 | 2/2009 | Honda et al. | |
| 2009/0070651 A1 * | 3/2009 | Diggs et al. | 714/752 |
| 2009/0113953 A1 | 5/2009 | Oh et al. | |
| 2009/0150599 A1 | 6/2009 | Bennett | |
| 2009/0177931 A1 | 7/2009 | Song et al. | |

(Continued)

OTHER PUBLICATIONS

Written Opinion & International Search Report dated:Jan. 16, 2014 from Patent Application Serial No. PCT/US2013/062723 11 pages.

*Primary Examiner* — John Trimmings (57) ABSTRACT

A data storage device may comprise an array of flash memory devices and a controller coupled thereto, configured to program and read data from the array responsive to received data access commands. The array may comprise a plurality of blocks, each comprising a plurality of flash pages (F-Pages), each of which comprising an integer number of one or more error correcting code pages (E-Pages), at least some of which comprising a data portion and an error correction code (ECC) portion. The controller may be configured to store a plurality of logical pages (L-Pages) in one or more of the plurality of E-Pages, at least some being unaligned with boundaries of the E-Pages; and to adjust, in at least one of the blocks, the size of the ECC portion and correspondingly adjust the size of the data portion of the E-Pages.

54 Claims, 6 Drawing Sheets

(56) References Cited

U.S. PATENT DOCUMENTS

| | | |
|---|---|---|
| 2009/0222643 A1 | 9/2009 | Chu |
| 2009/0240873 A1 | 9/2009 | Yu et al. |
| 2009/0241008 A1 | 9/2009 | Kim et al. |
| 2009/0241009 A1 | 9/2009 | Kong et al. |
| 2009/0259805 A1 | 10/2009 | Kilzer et al. |
| 2009/0292972 A1 | 11/2009 | Seol et al. |
| 2010/0030999 A1* | 2/2010 | Hinz ............................ 711/206 |
| 2010/0174851 A1 | 7/2010 | Leibowitz et al. |
| 2010/0211851 A1 | 8/2010 | Dixon |
| 2010/0241928 A1* | 9/2010 | Kim et al. .................... 714/763 |
| 2010/0268871 A1 | 10/2010 | Lee et al. |
| 2010/0306451 A1 | 12/2010 | Johnson |
| 2011/0055458 A1 | 3/2011 | Kuehne |
| 2011/0066788 A1 | 3/2011 | Eleftheriou et al. |
| 2011/0072194 A1 | 3/2011 | Forhan et al. |
| 2011/0072333 A1 | 3/2011 | Kuo |
| 2011/0099321 A1 | 4/2011 | Haines et al. |
| 2011/0099350 A1 | 4/2011 | Feldman et al. |
| 2011/0119464 A1 | 5/2011 | Karr et al. |
| 2011/0191566 A1 | 8/2011 | Takamiya et al. |
| 2011/0191654 A1* | 8/2011 | Rub ............................. 714/773 |
| 2011/0225346 A1 | 9/2011 | Goss et al. |
| 2011/0252289 A1 | 10/2011 | Patapoutian et al. |
| 2011/0283049 A1 | 11/2011 | Kang et al. |
| 2011/0320915 A1 | 12/2011 | Khan |
| 2012/0023387 A1 | 1/2012 | Wang et al. |
| 2012/0072807 A1 | 3/2012 | Cornwell et al. |
| 2012/0173795 A1 | 7/2012 | Schuette et al. |
| 2012/0221924 A1* | 8/2012 | Flynn et al. .................. 714/763 |
| 2012/0226887 A1 | 9/2012 | Culley et al. |
| 2013/0346829 A1* | 12/2013 | Koseki ........................ 714/764 |

\* cited by examiner

METHODS, DATA STORAGE DEVICES AND SYSTEMS HAVING VARIABLE SIZE ECC PAGE SIZE

BACKGROUND

In any die of a solid-state drive (SSD), there are likely to be a number of bad memory blocks, due to process technology and manufacturing variations, among other factors. Moreover, every block's endurance varies. In the early life of a die, most of the blocks are good. There are, however, some initial failures. During the bulk of the life of the die, random bit errors occur. Eventually, towards the end of life of the die, a wear affect manifests itself, in which the error rate increases. Every block goes through this lifecycle, albeit potentially at a different rate. Some blocks take a long time to go through this lifecycle, while others take a comparatively shorter period of time. To provide an adequate safety margin, however, conventional SSD systems are provisioned according to the worst-performing blocks.

Bits in a flash memory may be read incorrectly (i.e., develop bit errors) after being programmed. The charge level on a flash cell will change due to several conditions (time, temperature, accesses to other pages in the block, etc.). Eventually, when an affected cell is read, the wrong value is returned. flash manufacturers specify a maximum number of bit errors for a flash page based on the process technology, cell design, lab testing, simulation, operating conditions, and the like. The bit error specification is usually specified as P errors per M bytes. In some cases, the controller manufacturer is responsible for implementing an Error Correcting Code (ECC), which satisfies or exceeds the specification. Types of ECC include Reed Solomon, BCH and low-density parity-check (LDPC) codes, which are methods of correcting bit errors in a block of data bits. The life (Program/Erase (PE) cycles) of a flash device specified by a flash manufacturer is based on the implementation of the specified error correction requirements. flash manufacturers provide extra bytes in a flash page to accommodate the number of expected ECC bits plus a small amount of space for other metadata such as, for example, Cyclic Redundancy Check (CRC) field, sector number, and the like.

The Open NAND flash Interface (ONFI) specification, version 2.3, defines a flash Page as containing a data area and a spare area. The spare area is intended for use in holding ECC checkbits and metadata, while the data area is assumed to contain sector (e.g. logical block) data. Conventionally, a given ECC format is chosen at the outset and that chosen ECC strength is not changed over the life of the drive.

DETAILED DESCRIPTION

Figure 1A:
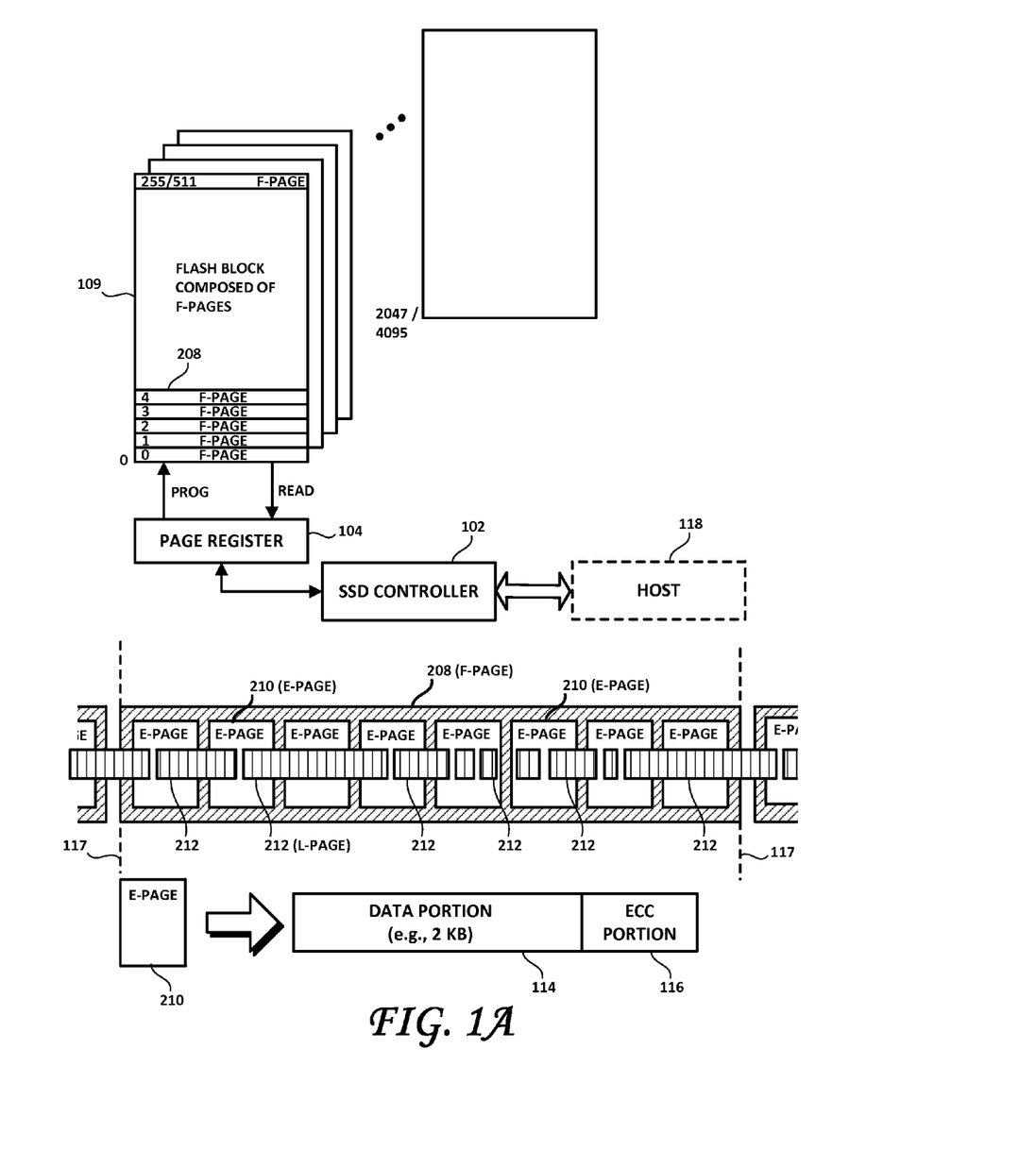
FIG. 1A is a diagram showing aspects of the physical and logical data organization of a data storage device according to one embodiment.

FIG. 1A is a diagram showing aspects of the physical and logical data organization of a data storage device according to one embodiment. In one embodiment, the data storage device is an SSD. In another embodiment, the data storage device is a hybrid drive including flash memory and rotating magnetic storage media. The disclosure is applicable to both SSD and hybrid implementations, but for the sake of simplicity the various embodiments are described with reference to SSD-based implementations. An SSD controller 102 according to one embodiment may be configured to be coupled to a host, as shown at reference numeral 118. The host 118 may utilize a logical block addressing (LBA) scheme. While the LBA size is normally fixed, the host can vary the size of the LBA dynamically. For example, the LBA size may vary by interface and interface mode. Indeed, while 512 Bytes is most common, the 4 KB size is also gaining favor, as are the 512+(520, 528, etc.) and 4K+(4K+8, 4K+16, etc.) formats. As shown therein, the SSD controller 102 may comprise or be coupled to one or more page registers 104. The controller may be configured to program and read data from an array of flash memory devices responsive to data access commands from host 118. While the description herein refers to flash memory generally, it is understood that the array of memory devices may comprise one or more of various types of non-volatile memory, such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof.

The page register 104 may be configured to enable the controller 102 to read data from and store data to the array. The array of flash memory devices may comprise a plurality of flash memory devices in one or more die (e.g., 128 die). The flash memory devices may comprise a plurality of flash blocks, such as shown at 109 in FIG. 1A. A combination of flash blocks, grouped together, may be called a Superblock or S-Block. In some embodiments, the individual blocks that form an S-Block may be chosen from one or more dies, planes or other levels of granularity. An S-Block, therefore, may comprise a plurality of flash blocks, spread across one or more die, that are combined together. In this manner, the S-Block may form a unit on which the Flash Management System (FMS) operates. In some embodiments, the individual blocks that form an S-Block may be chosen according to a different granularity than at the die level, such as the case when the memory devices include dies that are sub-divided into structures such as planes (i.e., blocks may be taken from individual planes). According to one embodiment, allocation, erasure and garbage collection may be carried out at the S-Block level. In other embodiments, the FMS may perform data operations according to other logical groupings such as pages, blocks, planes, dies, etc.

Each of the flash blocks 109 may comprise a plurality of physical pages such as flash pages (F-Pages) 208. Each F-Page 208 may be of a fixed size such as, for example, 8 KB. The size of the F-Page 208, according to one embodiment, may be defined as the size of the minimum unit of program for a given flash device. As also shown in FIG. 1A, each F-Page 208 may be configured to accommodate one or more physical sub-pages, such as Error Correcting Code (ECC) pages, hereinafter denoted as E-Pages 210. As used herein, the term "E-Page" refers to a data structure configured to store data, in non-volatile memory, over which an error correcting code has been applied. According to one embodiment, the E-Page 210 may form the basis for physical addressing within the SSD and may constitute the minimum unit of flash read data transfer. That is, each E-Page 210 may be configured to store the minimum amount of data readable by the controller 102. The E-Page 210 may be of a predetermined fixed size (such as 2 KB, for example) and determine the size of the payload (e.g., host or other data) of the ECC system. The size of the physical pages (e.g., E-Pages), however, need not be fixed. In one embodiment, the address of an E-Page uniquely identifies the location of the E-Page within the flash memory. For example, the E-Page's address may specify the flash channel, a particular die within the identified flash channel, a particular block within the die, a particular F-Page and, finally, the start of the E-Page within the identified F-Page.

According to one embodiment, each F-Page 208 may be configured to fit one or more E-Pages 210 within its boundaries. For example, given 16 KB wide F-Pages 208 and a fixed size of 2 KB per E-Page 210, eight E-Pages 210 fit within a single F-Page 208, as shown in FIG. 1A. In any event, according to one embodiment, an integer number of E-Pages, such as a power of 2 multiple of E-Pages 210, including ECC, may be configured to fit into an F-Page 208. As also shown in FIG. 1A, each E-Page 210 may comprise a data portion 114 and, depending on where the E-Page 210 is located, may also comprise an ECC portion 116. The ECC portion 116 may be configured to store the ECC that was applied to the data stored in the data portion 114 of the E-Page 210. According to one embodiment, neither the data portion 114 nor the ECC portion 116 needs to be fixed in size. Therefore, according to one embodiment, for a given E-Page size, the ratio between the size of the ECC portion and the size of the data portion within an E-Page may be varied.

Figure 1B:
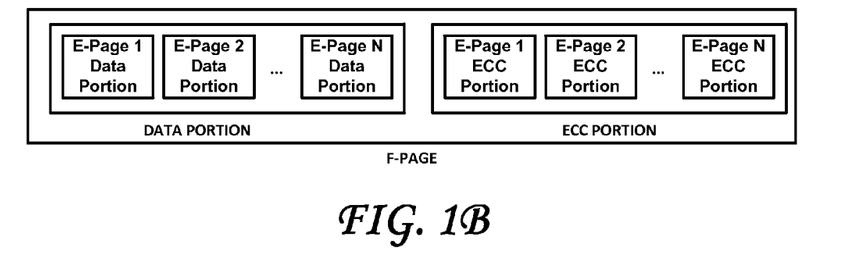
FIG. 1B is a diagram of an F-Page in which the data portion and ECC portion of each E-Page are physically separated, according to one embodiment.

The E-Pages, data portions, and ECC portions need not be arranged according to the example arrangement of FIG. 1A. For example, the data portion and ECC portion of each E-Page may be physically separated, so that the data portions are grouped together and the ECC portions are grouped together within an F-Page, as shown in FIG. 1B. Other arrangements of E-Pages, data portions, and ECC portions are possible in various embodiments, and the size adjustment methods disclosed herein are applicable to those embodiments as well. In one embodiment, an F-Page may include just one E-Page.

Indeed, to bridge between physical addressing on the SSD and logical block addressing by the host, a logical page (L-Page) construct is introduced. An L-Page, denoted by the reference numeral 212 in FIGS. 1A and 2, may comprise the minimum unit of address translation used by the flash management system. Each L-Page 212, according to one embodiment, may be associated with an L-Page number. In one embodiment, data is logically stored in L-Pages 212 and, L-Pages 212 is physically stored on the SSD in E-Pages 210. Whereas E-Pages 210 are, according to one embodiment, of a fixed size (an integer number of them may fit within an F-Page), the size of L-Pages 112, according to one embodiment, may be variable, due to variability in the compression of data to be stored. Since the compressibility of data varies, a 4 KB amount of data of one type may be compressed into a 2 KB L-Page while a 4 KB amount of data of a different type may be compressed into a 1 KB L-Page. Because of this compression, according to one embodiment, the physical and logical sizes need not be aligned, as is developed further herein. L-Pages 212 and their associated L-Page numbers, therefore, may be configured to enable the controller 102 to logically reference data (such as host data, for example) stored in one or more of the E-Pages 210. The L-Page 212 may also be utilized as the basic unit of compression. Indeed, unlike F-Pages 208 and E-Pages 210, L-Pages 212 are not, according to one embodiment, fixed in size and may vary with a range defined by a minimum compressed size of, for example, about 24 bytes to a maximum uncompressed size of, for example, about 4 KB or 4 KB+.

Figure 2:
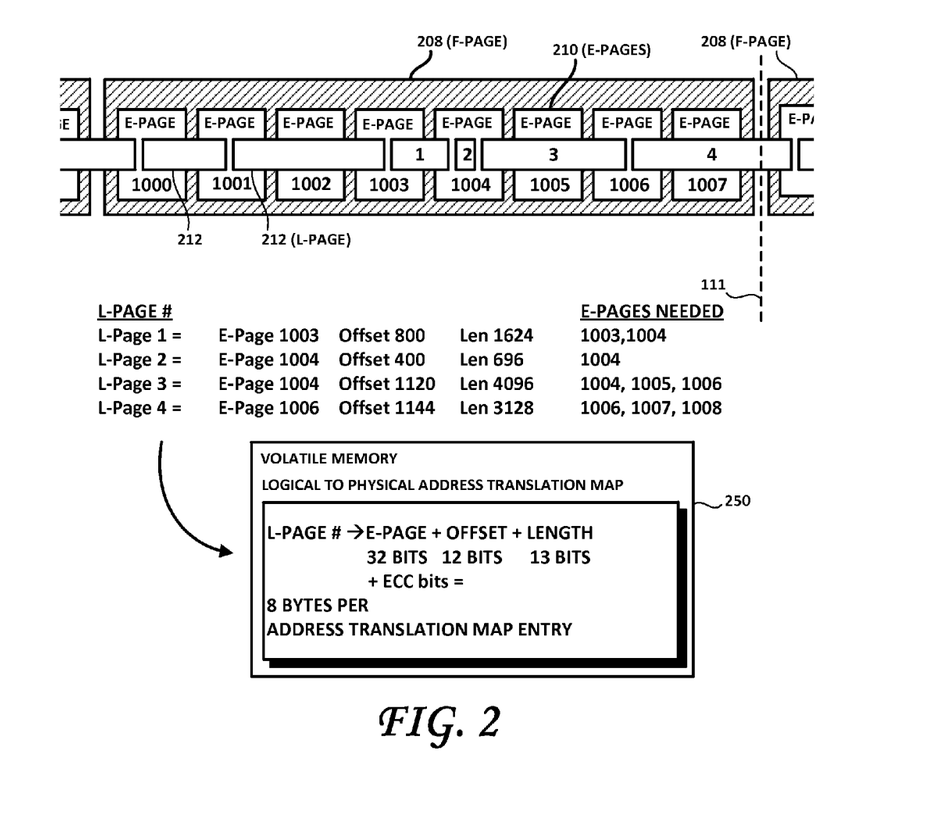
FIG. 2 shows a logical-to-physical address translation map and illustrative entries thereof, according to one embodiment.

As shown in FIGS. 1A and 2, L-Pages 212 need not be aligned with the boundaries of E-Page 210. Indeed, L-Pages 212 may be configured to have a starting address that is aligned with an F-Page 208 and/or E-Page 210 boundary, but also may be configured to be unaligned with either of the boundaries of an F-Page 208 or E-Page 210. That is, an L-Page starting address may be located at a non-zero offset from either the start or ending addresses of the F-Pages 208 or the start or ending addresses of the E-Pages 210, as shown in FIG. 1A. As the L-Pages 212 are not fixed in size and may be smaller than the fixed-size E-Pages 210, more than one L-Page 212 may fit within a single E-Page 210. Similarly, as the L-Pages 212 may be larger in size than the E-Pages 210, the L-Pages 212 may span more than one E-Page 210, and may even cross the boundaries of F-Pages 208, shown in FIG. 1A at numeral 117. As detailed further below, L-Pages 112 may also span block boundaries, such as would be the case wherein one of the boundaries 117 represented a block boundary.

Where the LBA size is 512 or 512+ bytes, a maximum of, for example, eight sequential LBAs may be packed into a 4 KB L-Page 212, given that an uncompressed L-Page 212 may be 4 KB to 4 KB+. It is to be noted that, according to one embodiment, the exact logical size of an L-Page 212 is unimportant as, after compression, the physical size may span from few bytes at minimum size to thousands of bytes at full size. For example, for 4 TB SSD device, 30 bits of addressing may be used to address each L-Page 112 to cover for an amount of L-Pages that could potentially be present in such a SSD.

FIG. 2 shows a logical-to-physical address translation map 250 and illustrative entries thereof, according to one embodiment. As stored data is referenced by the host in L-Pages 212 and as the SSD stores the L-Pages 212 in one or more E-Pages 210, a logical-to-physical address translation map is required to enable the controller 102 to associate an L-Page 212 to one or more E-Pages 210. Such a logical-to-physical address translation map (effectively, an L-Page to E-Page address translation map) is shown in FIG. 2 at 250 and, in one embodiment, is a linear array having one entry per L-Page 212. Such an address translation map 250 may be stored in a volatile memory, such as a DRAM.

FIG. 2 also shows entries in the address translation map 250 for four different L-Page numbers, which L-Page numbers are labeled in FIG. 2 as L-Page 1, L-Page 2, L-Page 3 and L-Page 4. According to one embodiment, each L-Page stored in the SSD may be pointed to by a single and unique L-Page number entry in the address translation map 250. Accordingly, in the example being developed herewith, four entries are shown. As shown, each entry in the map L-Page to E-Page translation 250 may comprise an L-Page number, which may comprise an identification of the E-Page containing the start address of the L-Page being referenced, the offset of the start address within the E-Page and the length of the L-Page. In addition, a plurality of ECC bits may provide error correction functionality for the map entry. For example, as shown in FIG. 2 and assuming an E-Page size of 2 KB, L-Page 1 may be referenced in the address translation map 250 as follows: E-Page 1003, offset 800, length 1,624, followed by a predetermined number of ECC bits (not shown). That is, in physical address terms, the start of the L-Page referenced by L-Page number L-Page 1 is within (not aligned with) E-Page 1003, and is located at an offset from the starting physical location of the E-Page 1003 that is equal to 800 bytes. The compressed L-Page associated with L-Page number L-Page 1, furthermore, extends 1,624 bytes, thereby crossing an E-Page boundary to E-Page 1004. Therefore, E-Pages 1003 and 1004 each store a portion of the L-Page associated with L-Page number L-Page 1.

Similarly, the compressed L-Page associated with L-Page number L-Page 2 is stored entirely within E-Page 1004, and begins at an offset therein of 400 bytes and extends only 696 bytes within E-Page 1004, thereby remaining entirely within the starting and ending address range designated as E-Page 1004. The compressed L-Page associated with L-Page number L-Page 3 starts within E-Page 1004 at an offset of 1,120 bytes (just 24 bytes away from the boundary of L-Page 2) and extends 4,096 bytes past E-Page 1005 and into E-Page 1006. Therefore, the L-Page associated with L-Page number L-Page 3 spans a portion of E-Page 1004, all of E-Page 1005 and a portion of E-Page 1006. Finally, the L-Page associated with L-Page number L-Page 4 begins within E-Page 1006 at an offset of 1,144 bytes, and extends 3,128 bytes to fully span E-Page 1007, to cross an F-Page boundary into E-Page 1008 of the next F-Page.

Collectively, each of these constituent identifier fields (E-Page, offset, length and ECC) making up each entry of the address translation map 250 may be, for example, 8 bytes in size. That is, for an exemplary 4 TB drive, the address of the E-Page may be 32 bits in size, the offset may be 12 bits (for E-Page data portions up to 4 KBE-Page) in size, the length may be 13 bits and the ECC field may be provided. Such an 8 byte entry may be created each time an L-Page is written or modified, to enable the controller 102 to keep track of the data (written in L-Pages) within the flash storage. As illustrated above, this 8-byte entry in the address translation map 250 may be termed a logical page number or LPN. It is to be noted that, in the case of a 4 KB sector size, the LBA is the same as the LPN. The LPN, therefore, may constitute the index of the L-Page within the logical-to-physical address translation table 250 and comprise the address of the entry within the non-volatile memory. Therefore, when the controller 102 receives a read command from the host 118, the LPN may be derived from the supplied LBA and used to index into the address translation map 250 to extract the location of the data to be read in the flash memory. When the controller 102 receives a write command from the host 118, the LPN may be constructed from the LBA and the address translation map 250 may be modified. For example, a new entry therein may be created. Depending upon the size of the volatile memory storing the address translation map 250, the LPN may be stored in a single entry or broken into, for example, two entries. For example, a first entry may identify the E-Page containing the starting address of the L-Page in question (plus ECC bits) and a second entry may identify the offset and length (plus ECC bits). Together, these two entries may correspond and point to a single L-Page within the flash memory. In other embodiments, the specific format of the address translation map entries may be different from the examples shown above.

Figure 3:
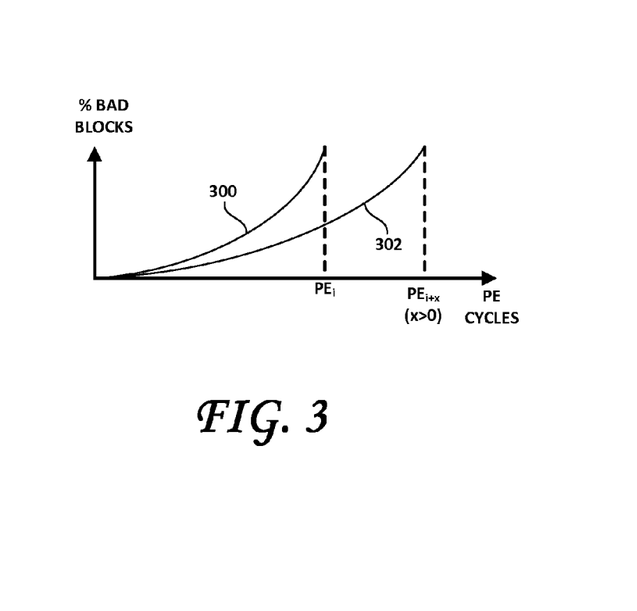
FIG. 3 shows a graph showing a percentage of bad blocks versus Program/Erase Cycles for both conventional devices and methods and according to one embodiment.
Figure 4:
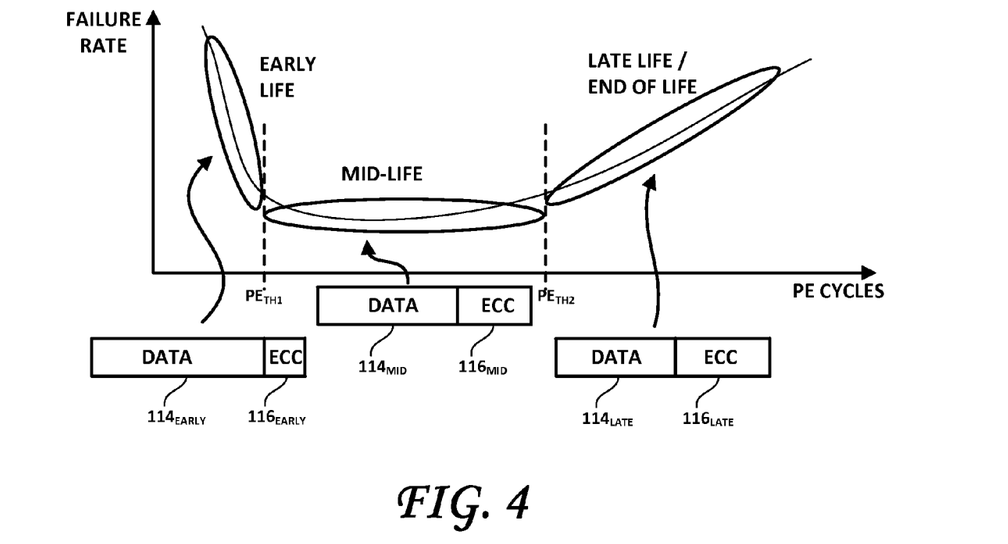
FIG. 4 is a diagram showing a relationship between block failure rates over the lifetime of a data storage device, and the manner in which the ECC and data portions of an E-Page may be varied to extend the useful lifetime of the data storage device, according to one embodiment.

The variable data portion sizes within the E-Pages are used in various ways to accommodate changing conditions of the memory blocks in the array of flash memory devices. The condition of the blocks is further discussed below with reference to FIGS. 3 and 4. FIG. 3 shows a graph showing a percentage of bad blocks versus PE cycles for both conventional devices and methods and those devices and methods according to various embodiments. FIG. 4 is a diagram showing a relationship between block failure rates over the lifetime of a data storage device such as a SSD, and the manner in which the ECC and data portions of an E-Page may be varied to extend the useful lifetime of the data storage device, according to one embodiment. The life cycle of blocks varies from block to block and die to die, with some blocks aging (becoming less able to reliably store data) quicker than other blocks. Such variations may be caused by process variations from die to die, the block location on the die and by use patterns and uneven PE cycles from one block to the next, among other reasons for uneven aging.

According to one embodiment, a data storage device may be configured to determine which of a plurality of ECC profiles to apply and/or to adjust the size of the ECC portion 116 and to correspondingly adjust a size of the data portion 114 of the E-Pages 210 in one or more F-Pages and/or one or more blocks, based at least in part on a condition of the block(s). The condition of the block may include, for example, a PE count of the block, an ECC error rate, flash error information, temperature, dwell time (time between erasure events), and internal flash state information, or most any other measurable physical characteristic such as operating conditions, temperature, age and the like. According to one embodiment, the controller may be configured to adjust the size of the ECC portion and/or the size of the data portion, based on host-provided meta data and/or overall free space in the data storage device. In doing so, one embodiment may operate to extend the useful life of the blocks from an initial PE count PE, as shown at 300 in FIG. 3 to a greater PE count of $PE_{i+x}$, where "x" is greater than zero, as shown at 302. This is because a block that has degraded can be programmed with a greater amount of ECC, thus extending its useful life. In addition, the variability of ECC at a block/page level also means that the applied ECC can be tailored to the unique condition of the individual blocks/pages and can track the degradation paths experienced by those individual blocks/pages.

As suggested in FIG. 3, the useful life of the SSD extends to a PE count at which the percentage of bad blocks reaches a predetermined maximum. In practice, this predetermined maximum may be dictated by the SSD's ability to garbage collect. When garbage collection is no longer possible, because of an insufficient number of free blocks, the SSD has effectively reached the end of its useful life, or at least has reached the end of its ability to store new data. By judiciously adjusting the size of the ECC portion 116 and by correspondingly adjusting the size of the data portion 114 of the E-Pages 210 in one or more blocks, based at least in part on a condition of the block(s), the number of memory blocks deemed to be "bad blocks" may rise more slowly with respect to PE cycles, resulting in the life of the SSD being increased as measured by the number of PE cycles. It is to be noted that, according to one embodiment, the selected ECC profile for a block may be maintained until at least the block in question has been garbage collected.

As shown in FIG. 4, the percentage of bad blocks observed is different for different points in the life cycle of the SSD. In early life (when the PE cycle count is low), the failure rate may be somewhat high; that is, there may be a comparatively higher incidence of page/block related failures. At least some of these early life page/block failures may be effectively uncorrectable using the ECC of the E-Pages. Paradoxically therefore, in early life, E-Pages may be configured with comparatively weaker ECC than in later stages of life, despite the relatively higher incidence of errors in the early life stage. A weaker ECC, moreover, may be provided in fewer bytes than would otherwise be necessary for a comparatively stronger ECC. Therefore, as shown, the ECC portion $116_{EARLY}$ may be adjusted to occupy a comparatively smaller number of bytes in the E-Page. In turn, this allows a correspondingly larger data portion $114_{EARLY}$, given the fixed size of the E-Pages. Advantageously, such larger data portions $114_{EARLY}$ frees up extra bytes, yields greater free space for data storage and garbage collecting and increases overprovisioning. Alternatively, to accommodate to the higher incidence of failure rate, a higher amount of ECC may be used in some embodiments.

In mid-life, the SSD's ability to balance the size of the data portion and the strength of the ECC is at its peak, resulting in an efficient use of E-Pages to optimize lifespan. As shown, mid-life is a relatively stable period in the lifespan of the SSD, as shown by the relatively flat failure rate curve. Therefore, a somewhat greater number of bytes may be utilized for the ECC as shown at $116_{MID}$ as compared to $116_{EARLY}$. The space within an E-Page at mid-life reserved for the data portion $114_{MID}$ may then be, according to one embodiment, comparatively smaller than the space reserved for the data portion of an early life E-Page, as shown at $114_{EARLY}$. A comparatively smaller data portion $114_{MID}$, moreover, may only yield a relatively smaller amount of additional free space, and consequently, only result in a relatively small increase in overprovisioning. Yet, this comparatively smaller data portion $114_{MID}$ may nevertheless, be greater than would be the case if the block had been provisioned for worst case failure rate, as is conventionally done.

Toward late or end of life, the data portion $114_{LATE}$ may be adjusted smaller still, to make room within the E-Page for an even stronger (e.g., larger) ECC portion $116_{LATE}$. As one embodiment increases the PE count of the SSD through adjustments of the sizes of the data and ECC portions and selection of the ECC profile, the ECC strength, in late life/end of life, may need to be increased relative to the ECC portion size conventionally used. Through judicious selection of the ECC strength at the time of programming, therefore, the maximum PE count of the SSD may be increased over that conventionally possible in the case in which the sizes of both the data portion and the ECC portion of the E-Pages are static. This is because in early and mid-life, the space allocated to ECC is smaller than is required by conventional practice in which the sizes of the ECC and data portions are static. According to one embodiment, even the increase in the ECC portion size and corresponding decrease in the data portion size in late/end of life is not sufficient to negate the gains achieved through the increased size of the data portion in early and mid-life, resulting in a net increase in the PE count over the useful lifetime of the data storage device.

One embodiment supports and tracks block-level configuration of the ECC dynamically, over the life cycle of the SSD. Beyond adjusting the ECC over the lifecycle, different ECCs may be used for different blocks based on block quality. Weak blocks may be provided with additional ECC, whereas comparatively stronger blocks may be provided with a relatively weaker ECC in a relatively smaller ECC portion 116, thereby yielding additional free space and a consequent increase in overprovisioning.

According to one embodiment, the controller 102 may be configured to increase the size of the ECC portion and correspondingly decrease the size of the data portion of one or more of the E-Pages when the PE count reaches a first pre-determined threshold $PE_{TH1}$, as the SSD transitions from early life to mid-life. Also according to one embodiment, the controller 102 may be configured to further increase the size of the ECC portion and again correspondingly decrease the size of the data portion of one or more of the E-Pages when the PE count reaches a second pre-determined threshold $PE_{TH2}$, as the SSD transitions from mid-life to late life/end of life. The second pre-determined threshold $PE_{TH2\ may\ be}$ higher than the first predetermined PE threshold $PE_{TH1}$. It is to be understood that the life stages (early, mid and late/end) described and shown herein are but exemplary stages and that a lesser or greater granularity (e.g., number) of life stages may be defined, with a correspondingly reduced or increased number of predetermined PE thresholds. Alternatively, the threshold governing the adjustments in the ECC portion and the data portions of the physical pages may be wholly independent of (or not solely dependent on) the PE count. Thus, embodiments are not to be limited to adjustments in the relative sizes of the data and ECC portions of physical pages based on a PE count. Indeed, other factors may drive or contribute such adjustments, such as the overprovisioning amount, free space, operating modes, operating temperatures, criticality of the data, safety margins and the like.

According to one embodiment, the choice of the strength (and the size) of the ECC portion may be made by a selection, by the controller 102, of one of a plurality of ECC profiles. According to one embodiment, such selection may be made at runtime. This selection may determine which of the plurality of ECC profiles to apply to one or more of the blocks, F-Pages or E-Pages. At least some of the ECC profiles may define different ECC strengths and, therefore, correspond to error correction codes that occupy a greater or lesser number of bytes and that are able to correct a greater or lesser amount of data (e.g., number of bits, symbols) stored in the physical pages. Given a fixed physical page size, the ECC profiles may dictate how many bytes are allocated to data in the data portion 114 and how many bytes are allocated to ECC in the ECC portion 116. Each profile may be associated with a different number. For example, 16 ECC profiles may be defined, which 16 ECC profiles, therefore, are addressable using 4 bits. The ECC profiles may be stored within or may be otherwise accessible to the controller 102 and selected based upon the condition of the E-Page(s), F-Page(s) or block(s) to be programmed.

According to one embodiment, the controller 102 may be further configured to determine which of the plurality of ECC profiles is to be applied across the E-Pages within the F-Pages of a block 109, at the time of programming the block 109. This, in turn, implies the ability for the controller 102 to apply different ones of the plurality of ECC profiles to different ones of the plurality of blocks 109, F-Pages 208 and/or E-Pages 210. For example, the controller 102 may be configured to select a first one of the plurality of ECC profiles to program F-Pages 208 of a first block 109 and to select a second one of the plurality of ECC profiles to program F-Pages 208 of a second block 109. In early and/or mid-life, the controller 102 may be configured to increase overprovisioning of the SSD by decreasing the size of the ECC portion 116 and correspondingly increasing the size of the data portion 114 of E-Pages 210 of a block 109 when, for example, the PE count of the block 109 is below a pre-determined or dynamically-selected or calculated threshold (e.g., $PE_{TH1}$ or $PE_{TH2}$).

According to one embodiment, the controller 102 may be further configured to determine which of the plurality of ECC profiles to apply to a block 109, F-Page 208 or E-Page 210 based on an error rate. When the error rate within a particular block 109, F-Page 208 or E-Page 210 is low, upon the next programming, the controller 102 may select an ECC profile defining a relatively smaller ECC portion 116 and a correspondingly greater data portion 114 for the particular E-Page 210, or E-Page(s) residing in the particular block 109 or F-Page 208. For example, the error rate may be based on a prior occurrence of ECC errors within a block 109, F-Page 208 or E-Page 210.

With reference back to FIG. 2, the L-Page associated with L-Page number L-Page 4 (L-Page 4) spans two F-Pages. Moreover, with continued reference to FIG. 2, dashed line 117 may indicate a block boundary, meaning that L-Page 4 spans two different blocks. According to one embodiment, the data portion of the E-Pages within a first F-Page may be corrected using the ECC according to a first ECC profile and the data portion of the E-Pages within a second F-Page may be corrected using the ECC according to a second ECC profile that is different than the first ECC profile. Therefore, it follows that the controller 102 may be further configured to read L-Pages, such as L-Page 4 of FIG. 2, that span across blocks (e.g., from a first block to a second block) and to accommodate two or more of the plurality of ECC profiles within a single read operation involving an L-Page. For example, the first F-Page may belong to a block that has transitioned into late life or end of life and whose E-Pages, therefore, comprise ECC portions 116 that may be of comparatively greater size than the ECC portions 116 of the E-Pages of the block to which the second F-Page belongs, which block may still be categorized as fitting within the mid-life stage, for example. Therefore, as the SSD is processing random host reads, there can be a plurality of different size ECC portions in the E-Pages present in the page register(s) 104.

According to one embodiment, any given block 109 may comprise a first E-Page having an ECC portion of a first size and a second E-Page having an ECC portion of a second size that is different from the first size. The second size, according to one embodiment, may be selected based on the location of the second E-Page within the block. In one embodiment, the different ECC portion sizes are selected based on the physical location, within a memory block of the F-Pages in which the first and second E-Pages reside. This F-Page location-based ECC profile selection may be useful in selecting the ECC profile to apply to particular F-Pages within a block. For example, the first F-Page of a block (such as F-Page 0 in FIG. 1A) and the last F-Page of a block (such as F-Page 255 in FIG. 1A) may be the worst F-Pages of the block, in terms of the occurrence of errors. Therefore, according to one embodiment, the ECC profile selected for the first and last F-Pages of a block may result in the controller 102 applying an ECC having a stronger error correcting capability to data stored in the physical pages (e.g., E-Pages) of the first and last F-Pages of a block. However, such location-influenced ECC profile selection is not limited to the first and last F-Pages of a block, but may be widely applied as needed to most efficiently extend the useful lifetime of the SSD and/or for any other purpose.

Figure 5:
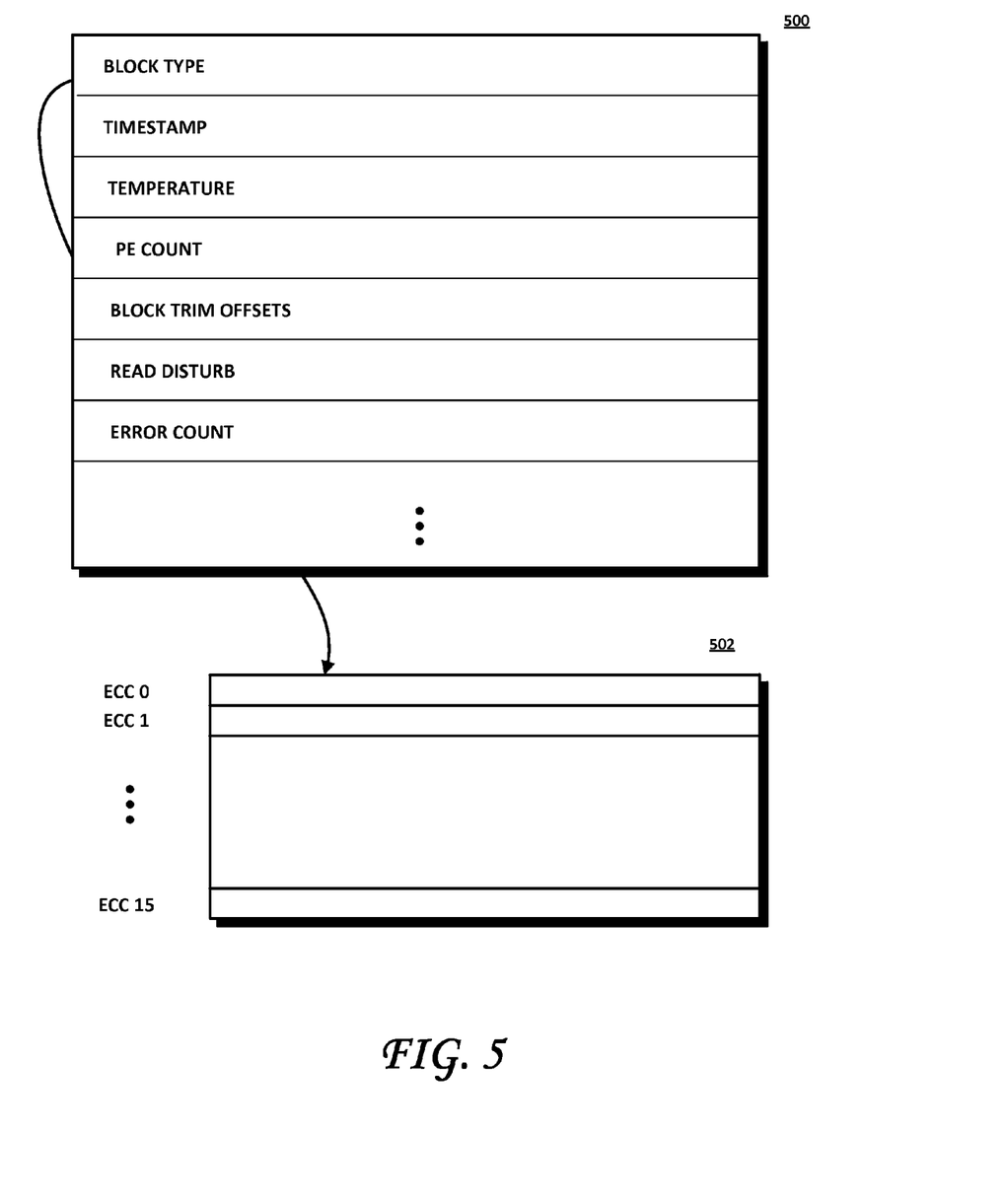
FIG. 5 is a diagram of a block information data structure, according to one embodiment.

FIG. 5 is a block diagram of a block information data structure, according to one embodiment. In one embodiment, every block 109 may be associated with, for example, about 32 bytes of information that may be stored, for example, in a block information data structure, as shown at 500 in FIG. 5. This or a similar block information data structure 500 may be saved by the controller firmware to the flash memory, so that the block information is stored in a non-volatile manner. As shown therein, the Block Type field may be configured to store which ECC profile has been applied to the data portions of the E-Pages of that particular block. Indeed, the ECC profile for each block should be tracked, as it is pulled out for every read, to enable the controller 102 to properly decode and error correct the data stored in the data portion of the E-Pages of that block. As shown, the Block Type field may occupy, for example, 4 bits to address a possible 16 ECC profiles. However, a greater or lesser number of ECC profiles may be provided, which may be selected using a greater or a lesser number of bits. The different ECC formats themselves may be stored in an ECC profile table, as shown at 502. The ECC profile table 502 may be referenced by the Block Type field of block information data structures 500.

It is to be noted that, should the strongest ECC format be ineffective in error-correcting data stored in the E-Pages of a given block, that block may be switched to lower page only (assuming MLC memory is used), meaning that instead of storing two bits per cell, only one bit per cell is stored. The Block Type field within the block information structure 500 may also indicate whether the block associated therewith is a fully bad block by storing, for example, a 0xFh value therein. Such a bad block is, in this manner, flagged as being thereafter unavailable for data storage, thereby potentially decreasing free space and overprovisioning. According to one embodiment, an ECC profile may be defined and selected to cause the controller 102 to skip an invalid F-Page during programming. This would be recognized by the controller 102, which would not program the invalid F-Page and skip to the next sequential F-Page of the block.

The block information data structure 500, as shown in FIG. 5, may also comprise a Timestamp field, which may indicate the date and time of the last write. The block information data structure 500 may also include a Temperature field, to store temperature-related information, and a PE Count field to track the number of program/erase cycles undergone by the block, which field may be used, for example, when selecting the ECC profile to use and may, therefore, influence the selected size of the data portion 114 and the ECC portion 116 of the E-Pages of the block, as detailed earlier. One or more Block Trim Offset fields of the block information data structure 500, may be used by the SSD's firmware to adjust internal settings of the flash device. The Block Trim Offset fields may be provided with their own error correction. Moreover, the block's TRIM information may be configured to contain data relative to the health of a block, such that if errors become uncorrectable using the current ECC, that information may be used to change the ECC profile and increase the strength of the ECC used to provide error correction for data stored in the E-Pages of that block. A Read Disturb field may be provided, to contain a number of times that this block has been read. An Error Count field may track the number of errors encountered in the block.

FIG. 5 provides an example format for storing information related to a block. in other embodiments, the information may be stored at a different level of granularity. For example, in some embodiments, each E-Page or F-Page may have its own profile designation and corresponding information. Also, the information may be stored in a format that is different from the example depicted in FIG. 5.

Figure 6A:
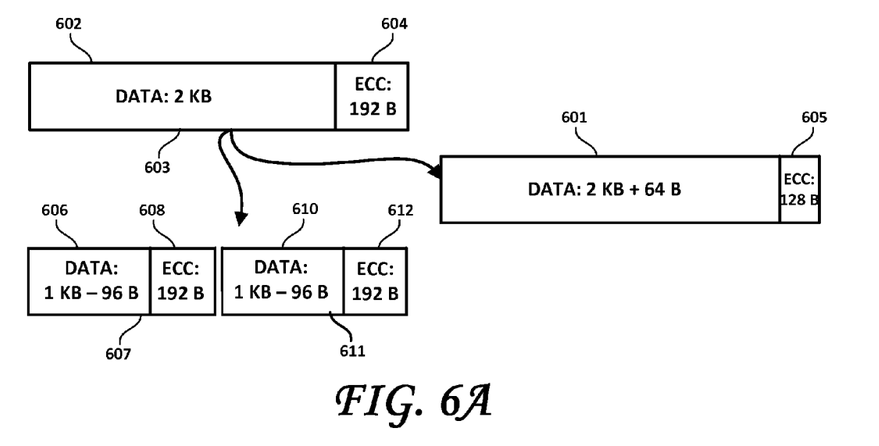
FIG. 6A shows adjusting a data portion and correspondingly adjusting an ECC portion of an E-Page and shows an E-Page split into two smaller E-Pages, with corresponding variations in the data and ECC portions, according to one embodiment.

Besides directly adjusting the sizes of the data portions and/or ECC portions, embodiments may accomplish size adjustment by combining multiple E-Pages into a single E-Page, and/or splitting a single E-Page into multiple E-Pages. FIG. 6A shows adjusting a data portion and correspondingly adjusting an ECC portion of an E-Page and shows an E-Page split into two smaller E-Pages, with corresponding variations in the data and ECC portions, according to one embodiment. As shown therein, reference numeral 602 denotes a 2 KB data portion of the E-Page and 604 denotes a 192 byte ECC portion of an E-Page 603. According to one embodiment, the size of the ECC portion 604 (i.e., the number of bytes that fit within the ECC portion 604) may be adjusted and the data portion 602 may be correspondingly adjusted, such that both size-adjusted portions 602, 604 fit within a fixed-size E-Page 603. For example, the ECC portion 604 may be adjusted to be 64 bytes narrower, as shown at 605, such that the ECC portion is adjusted from 192 bytes at reference 604 to 128 bytes at reference 605. The data portion 601 may be correspondingly adjusted to be 64 bytes wider, such that the data portion is adjusted from 2 KB at reference 602 to an adjusted 2 KB+64 bytes, as shown at reference 601. Alternatively, the data portion 601 may be correspondingly adjusted to be 64 bytes smaller in size, such that the data portion is adjusted from 2 KB at reference 602 to an adjusted 2 KB-64 bytes.

As also shown in FIG. 6A, two E-Pages 607, 611 may be created from this single E-Page 603. Each of these two E-Pages 607, 611 may comprise an ECC portion 608, 612 and a data portion 606, 610. According to one embodiment, the data portions 606, 610 each may have a size equal to a difference of half of the size of a data portion of the single E-Page (1 KB) and half of the size of an ECC portion of the single E-Page (96 bytes). The ECC portions 608, 612 remain at 192 bytes each. In this manner, the ability to adjust the respective sizes of the data and ECC portions of physical E-Pages allows two E-Pages to be created within the same space as a single 2 KB+192 byte E-Page, with the data portions thereof being reduced by an amount necessary (96 bytes) to enable each to comprise a full 192 byte ECC portion. Other adjustments are possible.

Figure 6B:
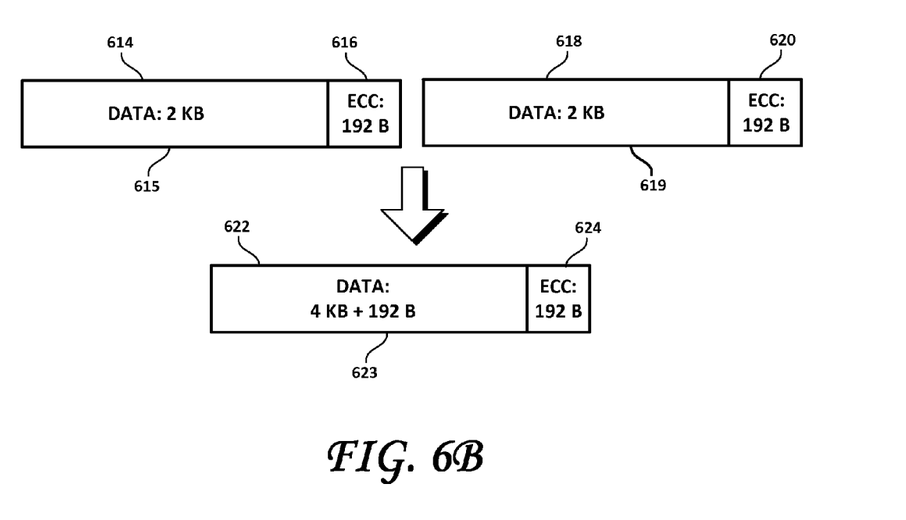
FIG. 6B shows two E-Pages combined into a single, larger E-Page, with corresponding changes to the data and ECC portions, according to one embodiment.

FIG. 6B shows the functionality of concatenating two E-Pages into a combined, larger E-Page, with corresponding changes to the data and ECC portions, according to one embodiment. As shown therein, a first E-Page 615 comprises a 2 KB data portion 614 and a 192 byte ECC portion 616. Similarly, the second E-Page 619 comprises a first data portion 618 and a second ECC portion 620. The concatenation of the first E-Page 615 and the second E-Page 619 may result in a concatenated E-Page 623 comprising a data portion 622 and an ECC portion 622. In this case, the data portion 622 of the concatenated E-Page 623 may have a size equal to a sum of the sizes of the data portions of the first and second E-Pages (in this case, 4 KB) plus the size of the ECC portion (192 bytes). Similarly, the ability to adjust the respective sizes of the data and ECC portions of physical E-Pages enables a single E-Page 623 to be created within the same space as two single E-Pages 615, 619, with the data portion thereof being increased by the size of the ECC portion of one of the two individual E-Pages. It should be noted that E-Pages may be split into smaller constituent E-Pages or combined to form larger E-Pages than shown and described herein.

Figure 7:
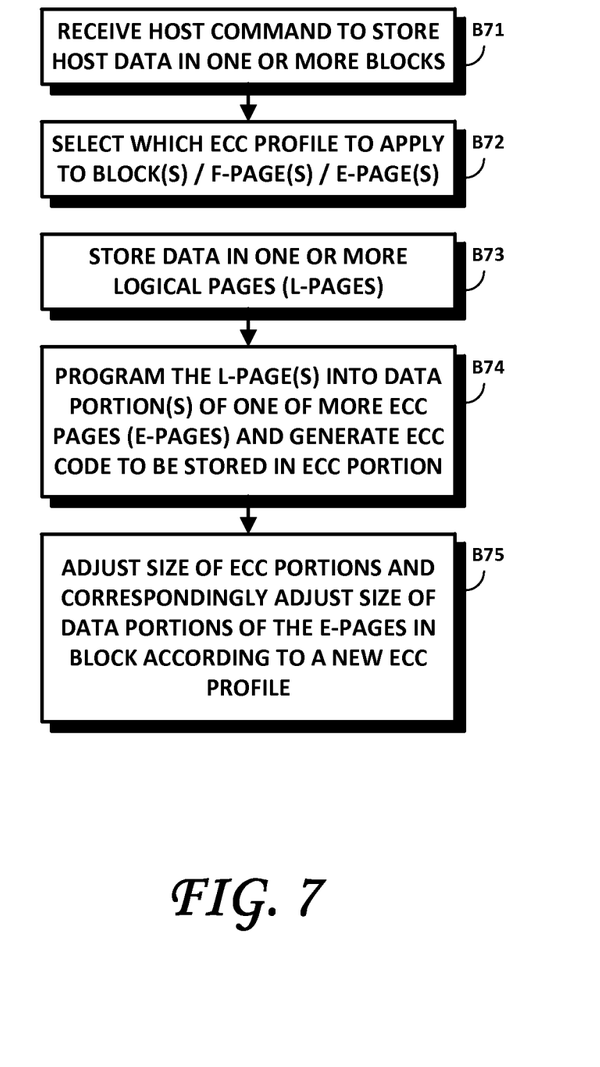
FIG. 7 is a flowchart showing a method of controlling an array of flash memory devices responsive to data access commands from a host, according to one embodiment.

FIG. 7 is a flowchart showing a method of controlling an array of flash memory devices responsive to data access commands from a host, according to one embodiment. As shown, block B71 calls for receiving a host command to store host data in one or more of a plurality of blocks of the array of flash memory devices. As shown in FIGS. 1 and 2, each of the plurality of blocks may comprise a plurality of F-Pages and each of these F-Pages may comprise an integer number of one or more physical pages such as E-Pages, at least some of which comprise a data portion and an ECC portion, as shown at FIG. 1A. Block B72 calls for the selection, from a plurality of ECC profiles, of an ECC profile to apply to the one or more of the plurality of block(s), F-Page(s) and/or E-Page(s) to which data (such as, for example, data originating from the host 118) is to be stored. Data may then be stored in one or more L-Pages, as shown at block B73. As shown in block B74, the L-Page(s) may then be programmed into the data portion of one or more of the plurality of E-Pages and the selected ECC code may be generated to be stored in the ECC portion. In one embodiment, the sizes of the E-Page data/ECC portions are based on an ECC profile. Thereafter, in response to a change in condition of a block of the plurality of block (or for any other reason), the size of the ECC portion may be adjusted, for example, at a next programming and the size of the data portion correspondingly adjusted. The adjustment may be done according to a new ECC profile at the time of a next programming, as shown at B75. As described above, the change in condition may be based on a number of factors/metrics such as PE counts, error rates, temperature, etc.

While certain embodiments of the disclosure have been described, these embodiments have been presented by way of example only, and are not intended to limit the scope of the disclosure. Indeed, the novel methods, devices and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. For example, those skilled in the art will appreciate that in various embodiments, the actual structures (such as, for example, the structure of the SSD blocks or the structure of the physical or logical pages) may differ from those shown in the figures. Moreover, although the ECC strength may be adjusted based on prior programming or the occurrence of ECC errors or the rate of such errors, other motivations and physical parameters may drive or influence the amount or aggressiveness of the adjustments in the ECC applied to data stored in the physical pages. Depending on the embodiment, certain of the steps described in the example above may be removed, others may be added. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

The invention claimed is:

1. A data storage device, comprising:
an array of flash memory devices; and
a controller coupled to the array of memory devices and configured to program and read data from the array of flash memory devices responsive to data access commands from a host, wherein the array of flash memory devices comprises:
a plurality of blocks, each comprising a plurality of flash pages (F-Pages), each of the plurality of F-Pages comprising an integer number of one or more error correcting code pages (E-Pages), at least some of the E-Pages comprising a data portion and an error correction code (ECC) portion;
wherein the controller is configured to:
store a plurality of logical pages (L-Pages) in one or more of the plurality of E-Pages, at least some of the plurality of L-Pages being unaligned with boundaries of the E-Pages; and
adjust, in at least one of the F-Pages, a size of the ECC portion and correspondingly adjust a size of the data portion of one or more E-Pages of the at least one F-Page, wherein the controller is further configured to decrease the size of the data portion by an amount that the size of the ECC portion has been increased.

2. The data storage device of claim 1, wherein each E-Page is configured to store a minimum amount of data readable by the controller.

3. The data storage device of claim 1, wherein the controller is further configured to adjust a size of the ECC portion and to correspondingly adjust a size of the data portion of the one or more E-Pages of the at least one F-Page in accordance with one of a plurality of ECC profiles.

4. The data storage device of claim 3, wherein at least some of the plurality of ECC profiles are configured to correct a different amount of data stored in the E-Page.

5. The data storage device of claim 3, wherein the controller is further configured to determine which of the plurality of ECC profiles is to be applied across F-Pages of a block of the plurality of blocks, at a time of programming the block.

6. The data storage device of claim 3, wherein the controller is further configured to apply different ones of the plurality of ECC profiles to different ones of the plurality of blocks.

7. The data storage device of claim 3, wherein the controller is further configured to determine which of the plurality of ECC profiles to apply to a block of the plurality of blocks, an F-Page of the plurality of F-Pages or an E-Page of the plurality of E-Pages, at runtime.

8. The data storage device of claim 3, wherein the controller is further configured to determine which of the plurality of ECC profiles to apply to a block, an F-Page or an E-Page based on an error rate.

9. The data storage device of claim 8, wherein the error rate is based on a prior occurrence of ECC errors within the block, the F-Page or the E-Page.

10. The data storage device of claim 3, wherein the controller is further configured to determine which of the plurality of ECC profiles to apply to a block based on a program/erase (PE) count of the block.

11. The data storage device of claim 3, wherein the controller is further configured to read L-Pages that span across blocks and to accommodate two or more of the plurality of ECC profiles within a single read operation involving an L-Page.

12. The data storage device of claim 3, wherein one of the plurality of ECC profiles is configured, when used in an invalid F-Page, to cause the controller to skip the invalid F-Page when programming.

13. The data storage device of claim 1, wherein the controller is further configured to increase a size of the ECC portion and correspondingly decrease a size of the data portion of one or more of the E-Pages of a block when a program/erase (PE) count of the block reaches a pre-determined threshold.

14. The data storage device of claim 1, wherein the controller is further configured to increase overprovisioning of the storage device by decreasing a size of the ECC portion and correspondingly increasing a size of the data portion of E-Pages of a block when a program/erase (PE) count of the block is below a pre-determined threshold.

15. The data storage device of claim 1, wherein the controller is further configured to adjust the size of the ECC portion based at least in part on a condition of the block in which the at least one F-Page resides.

16. The data storage device of claim 15, wherein the condition is based at least one of: an ECC error rate, flash error information, a temperature, a dwell time, and internal flash state information.

17. The data storage device of claim 1, wherein the controller is further configured to adjust at least one of: (1) the size of the ECC portion, and (2) the size of the data portion, based on at least one of: host-provided meta data and overall free space in the data storage device.

18. A method of controlling an array of flash memory devices responsive to data access commands from a host, comprising:
receiving a host command to store host data in one or more of a plurality of blocks of the array of flash memory devices, each of the plurality of blocks comprising a plurality of flash pages (F-Pages), each of the plurality of F-Pages comprising an integer number of one or more error correcting code (ECC) pages (E-Pages), at least some of the E-Pages comprising a data portion and an ECC portion;
selecting an ECC profile of a plurality of ECC profiles to apply to the one or more of the plurality of blocks, F-Pages or E-Pages to which the host data is to be stored;
storing the host data in one or more logical pages (L-Pages);
programming the one or more of L-Pages into the data portion of one or more of the plurality of E-Pages and generating an ECC code to be stored in the ECC portion of one or more of the plurality of E-Pages according to the selected ECC profile; and
adjusting, in at least one of the F-Pages, a size of the ECC portion and correspondingly adjusting a size of the data portion of one or more E-Pages of the at least one F-Page according to a new ECC profile, wherein adjusting comprises decreasing the size of the data portion by an amount that the size of the ECC portion has been increased.

19. The method of claim 18, wherein each E-Page is configured to store a minimum amount of data readable by the controller.

20. The method of claim 18, wherein the adjusting further comprising selecting the new profile from the plurality of ECC profiles.

21. The method of claim 18, wherein at least some of the plurality of ECC profiles are configured to correct a different amount of data stored in the E-Page.

22. The method of claim 18, wherein selecting comprises selecting a first one of the plurality of ECC profiles to program F-Pages of a first block of the plurality of blocks and selecting a second one of the plurality of ECC profiles to program F-Pages of a second block of the plurality of blocks.

23. The method of claim 18, further comprising increasing a size of the ECC portion and correspondingly decreasing a size of the data portion of one or more of the E-Pages of a block of the plurality of blocks when a program/erase (PE) count of the block reaches a predetermined threshold.

24. The method of claim 18, further comprising increasing overprovisioning of the array of flash memory devices by decreasing a size of the ECC portion and correspondingly increasing a size of the data portion of E-Pages of a block of the plurality of blocks when a program/erase (PE) count of the block is below a predetermined threshold.

25. The method of claim 18, wherein adjusting comprises adjusting based at least in part upon a condition of the block in which the at least one F-Page resides.

26. The method of claim 25, wherein the condition is based at least one of: an ECC error rate, flash error information, a temperature, a dwell time, and internal flash state information.

27. The method of claim 18, wherein adjusting comprises adjusting at least one of: (1) the size of the ECC portion, and (2) the size of the data portion, based on at least one of: host-provided meta data and overall free space in the data storage device.

28. The method of claim 18, wherein selecting an ECC profile to apply comprises selecting based on an error rate.

29. The method of claim 28, wherein the error rate is based on a prior occurrence of ECC errors within a block of the plurality of blocks, an F-Page of the plurality of F-Pages or an E-Page of the plurality of E-Pages.

30. The method of claim 18, wherein selecting comprises selecting based on a PE count of a block of the plurality of blocks.

31. The method of claim 18, wherein one of the plurality of profiles is configured, when used in an invalid F-Page, to the invalid F-Page to be skipped when a programming operation is performed in the block in which the invalid F-Page resides.

32. The method of claim 18, further comprising compressing the host data in the L-Pages before programming them into the data portion of one or more of the plurality of E-Pages.

33. The method of claim 18, further comprising maintaining the selected ECC profile for a block of the plurality of blocks until at least a garbage collection of the block has occurred.

34. The method of claim 18, further comprising creating a concatenated E-Page from a first E-Page and a second E-Page, the concatenated E-Page comprising an ECC portion and a data portion, the data portion having a size equal to a sum of the sizes of the data portions of the first and second E-Pages plus the size of the ECC portion.

35. The method of claim 18, further comprising creating two E-Pages from a single E-Page, each of the two E-Pages having an ECC portion and a data portion, the data portion having a size equal to a difference of the size of a data portion of the single E-Page and half of the size of an ECC portion of the single E-Page.

36. A solid state drive controller, comprising:
a buffer configured to couple to an array of flash memory devices; and
a processor coupled to the buffer, the processor being configured to program and read data from the array of flash memory devices responsive to data access commands from a host, the array of flash memory devices comprising a plurality of blocks, each comprising a plurality of flash pages (F-Pages), each of the plurality of F-Pages comprising an integer number of one or more error correcting code pages (E-Pages), at least some of the E-Pages comprising a data portion and an error correction code (ECC) portion,
wherein the processor is further configured to:
store a plurality of logical pages (L-Pages) in one or more of the plurality of E-Pages; and
adjust, in at least one of the F-Pages, a size of the ECC portion and correspondingly adjust a size of the data portion of the E-Pages of the one or more E-Pages of the at least one F-Page,
wherein the processor is further configured to decrease the size of the data portion by an amount that the size of the ECC portion has been increased.

37. The solid state drive controller of claim 36, wherein the processor is further configured to carry out a first read of a first data configured according to a first one of a plurality of different ECC profiles and to carry out a second read of a second data configured according to a second one of the plurality of different ECC profiles and to store the read first and second data in the buffer.

38. The solid state drive controller of claim 36, wherein each E-Page is configured to store a minimum amount of data readable by the processor.

39. The solid state drive controller of claim 36, wherein the processor is further configured to adjust a size of the ECC portion and to correspondingly adjust a size of the data portion of the E-Pages of the block in accordance with one of a plurality of ECC profiles.

40. The solid state drive controller of claim 39, wherein at least some of the plurality of ECC profiles are configured to correct a different amount of data stored in the E-Page.

41. The solid state drive controller of claim 39, wherein the processor is further configured to determine which of the plurality of ECC profiles is to be applied across F-Pages of a block of the plurality of blocks, at a time of programming the block.

42. The solid state drive controller of claim 41, wherein the processor is further configured to apply different ECC profiles to different ones of the plurality of blocks or to different ones of the plurality of F-Pages of a block of the plurality of blocks.

43. The solid state drive controller of claim 39, wherein the processor is further configured to determine which of the plurality of ECC profiles to apply to a block of the plurality of blocks, an F-Page of the plurality of F-Pages or an E-Page of the plurality of E-Pages, at runtime.

44. The solid state drive controller of claim 39, wherein the processor is further configured to determine which of the plurality of ECC profiles to apply to a block of the plurality of blocks, an F-Page of the plurality of F-Pages or an E-Page of the plurality of E-Pages, based on an error rate.

45. The solid state drive controller of claim 44, wherein the error rate is based on a prior occurrence of ECC errors within the block.

46. The solid state drive controller of claim 39, wherein the processor is further configured to read L-Pages that span across blocks and to accommodate two or more of the plurality of ECC profiles within a single read operation involving an L-Page.

47. The solid state drive controller of claim 36, wherein one of the plurality of ECC profiles is configured, when used in an invalid E-Page, such that the processor skips the invalid F-Page when programming.

48. The solid state drive controller of claim 36, wherein the processor is further configured to increase a size of the ECC portion and correspondingly decrease a size of the data portion of one or more of the E-Pages when a program/erase (PE) count reaches a predetermined threshold.

49. The solid state drive controller of claim 36, wherein the processor is further configured to increase overprovisioning by decreasing a size of the ECC portion and correspondingly increasing a size of the data portion of E-Pages of a block when a program/erase (PE) count of the block is below a predetermined threshold.

50. The solid state drive controller of claim 36, wherein the processor is further configured to adjust the size of the ECC portion based at least in part on a condition of the block in which the at least one F-Page resides.

51. The solid state drive controller of claim 50, wherein the condition is based at least one of: an ECC error rate, flash error information, a temperature, a dwell time, and internal flash state information.

52. The solid state drive controller of claim 36, wherein the processor is further configured to adjust at least one of: (1) the size of the ECC portion, and (2) the size of the data portion, based on at least one of: host-provided meta data and overall free space in the data storage device.

53. The solid state drive controller of claim 36, wherein the processor is further configured to determine which of the plurality of ECC profiles to apply to a block of the plurality of blocks based on a PE count of the block.

54. A data storage device, comprising:
an array of flash memory devices; and
a controller coupled to the array of memory devices and configured to program and read data from the array of flash memory devices responsive to data access commands from a host, wherein the array of flash memory devices comprises:
a plurality of blocks, each comprising a plurality of flash pages (F-Pages), each of the plurality of F-Pages comprising an integer number of one or more error correcting code pages (E-Pages), at least some of the E-Pages comprising a data portion and an error correction code (ECC) portion;
wherein the controller is configured to:
store a plurality of logical pages (L-Pages) in one or more of the plurality of E-Pages, at least some of the plurality of L-Pages being unaligned with boundaries of the E-Pages; and
decrease a size of the data portion of one or more E-Pages of the at least one F-Page by an amount that a size of the ECC portion has been increased; and
wherein, one of the plurality of blocks comprises:
a first E-Page having an ECC portion of a first size; and
a second E-Page having an ECC portion of a second size, wherein the second size is different from the first size, wherein the second size is selected based on a location of the second E-Page in the block.

* * * * *